United States Patent
Bang et al.

(10) Patent No.: US 12,100,621 B2
(45) Date of Patent: Sep. 24, 2024

(54) METHOD OF PROCESSING WAFER

(71) Applicant: DISCO CORPORATION, Tokyo (JP)

(72) Inventors: Hyeonjin Bang, Tokyo (JP); Kisuk Bang, Tokyo (JP); Taehee Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 605 days.

(21) Appl. No.: 17/387,591

(22) Filed: Jul. 28, 2021

(65) Prior Publication Data

US 2022/0051943 A1    Feb. 17, 2022

(30) Foreign Application Priority Data

Aug. 13, 2020    (JP) .................................. 2020-136679

(51) Int. Cl.
*H01L 21/78*      (2006.01)
*B23K 26/046*    (2014.01)
*B23K 26/364*    (2014.01)
*B23K 26/50*      (2014.01)

(52) U.S. Cl.
CPC ............ *H01L 21/78* (2013.01); *B23K 26/046* (2013.01); *B23K 26/364* (2015.10); *B23K 26/50* (2015.10)

(58) Field of Classification Search
CPC .............. H01L 21/78; H01L 21/67092; H01L 21/67115; H01L 21/67132; B23K 26/046; B23K 26/364; B23K 26/50; B23K 2103/56; B23K 26/0006; B23K 26/03; B23K 26/08; B23K 26/53; B23K 2101/40; B23K 26/60; B23K 26/702
See application file for complete search history.

(56) References Cited

U.S. PATENT DOCUMENTS

| | | | |
|---|---|---|---|
| 8,847,108 B2 * | 9/2014 | Kobayashi ........... | B23K 26/046 219/121.68 |
| 10,283,424 B1 * | 5/2019 | Chen ....................... | H01L 22/20 |
| 2006/0035444 A1 * | 2/2006 | Nakamura .......... | H01L 21/6836 438/464 |
| 2009/0066969 A1 * | 3/2009 | Sawabe .............. | G01B 11/0608 356/614 |
| 2012/0244663 A1 * | 9/2012 | Mori ....................... | H01L 24/92 257/E21.599 |
| 2019/0206734 A1 * | 7/2019 | Sekiya .................. | H01L 21/268 |
| 2019/0221480 A1 * | 7/2019 | Priewasser .......... | H01L 21/6836 |
| 2021/0398855 A1 * | 12/2021 | Sakamoto .......... | B23K 26/0006 |

FOREIGN PATENT DOCUMENTS

JP          2009269074 A     11/2009

* cited by examiner

*Primary Examiner* — Galina G Yushina
(74) *Attorney, Agent, or Firm* — Greer, Burns & Crain, Ltd.

(57) ABSTRACT

A method of processing a wafer having a plurality of intersecting streets on a face side thereof with protrusions on the streets includes a holding step of holding a protective sheet of a wafer unit on a holding table, an upper surface heightwise position detecting step of detecting a heightwise position of an upper surface of a reverse side of the wafer along the streets, and a laser beam applying step of applying a laser beam having a wavelength transmittable through the wafer to the wafer from the reverse side thereof along the streets while positioning a focused point of the laser beam within the wafer on the basis of the heightwise position, to thereby form modified layers in the wafer along the streets.

22 Claims, 14 Drawing Sheets

METHOD OF PROCESSING WAFER

BACKGROUND OF THE INVENTION

Field of the Invention

The present invention relates to a method of processing a wafer having a plurality of intersecting streets on a face side thereof with protrusions on the streets.

Description of the Related Art

Heretofore, there has been known a method of processing a semiconductor wafer by applying a laser beam to the wafer while positioning a focused point of the laser beam within the wafer, thereby forming modified layers in the wafer along streets, i.e., projected dicing lines, on a face side of the wafer, and applying external forces to the wafer to divide the wafer along the streets into device chips.

Since the modified layers need to be formed at a constant height or vertical position in the wafer, it has been customary to detect the height of a wafer surface irradiated with the laser beam along the streets, adjust the position of the focused point of the laser beam on the basis of the detected height, and apply the laser beam to the wafer while positioning the positionally adjusted focused point of the laser beam within the wafer (see, for example, JP 2009-269074A).

SUMMARY OF THE INVENTION

However, when the face side of a wafer with protrusions such as test element groups (TEGs) formed on streets thereof is held under suction on a flat holding surface of a holding table, the height of areas of the reverse side of the wafer where the TEGs exist, i.e., a heightwise position of an upper surface of the reverse side, is larger than the height of areas free of the TEGs.

If the focused point of the laser beam is positioned on the basis of the detected height of the upper surfaces of the reverse side, then modified layers will be formed in the wafer at positions shifted toward the reverse side of the wafer in the areas where the TEGs exist, compared with the areas free of the TEGs. Consequently, the modified layers will be formed in the wafer at different heightwise positions.

Particularly, in a case where a wafer to which a laser beam is to be applied has a small thickness of 50 μm or less, the position of the focused point of the laser beam tends to be too close to the reverse side of the wafer in the areas where the TEGs exist, possibly resulting in ablation of the wafer.

It is therefore an object of the present invention to provide a method of processing a wafer having protrusions such as TEGs on streets in a manner to be able to minimize differences between positions at which modified layers are formed in the wafer.

In accordance with an aspect of the present invention, there is provided a method of processing a wafer having a plurality of intersecting streets on a face side thereof with protrusions on the streets. The method includes a laying step of laying the face side of the wafer on a curable resin of a protective member including a protective sheet and the curable resin disposed on the protective sheet and curable by an external stimulus, with a resin film interposed between the face side of the wafer and the curable resin, embedding the protrusions on the face side of the wafer in the curable resin, to thereby render a reverse side of the wafer flat; after the laying step, a wafer unit forming step of applying the external stimulus to the curable resin to cure the curable resin into a cured resin layer, thereby forming a wafer unit including the protective sheet, the cured resin layer on the protective sheet, the resin film on the cured resin layer, and the wafer disposed on the resin film with the reverse side of the wafer being exposed; a holding step of holding the protective sheet of the wafer unit on a holding table; after the holding step, an upper surface heightwise position detecting step of detecting a heightwise position of an upper surface of the reverse side of the wafer along the streets; and a laser beam applying step of applying a laser beam having a wavelength transmittable through the wafer to the wafer from the reverse side thereof along the streets while positioning a focused point of the laser beam within the wafer on the basis of the heightwise position detected in the upper surface heightwise position detecting step, to thereby form modified layers in the wafer along the streets.

Preferably, the method of processing a wafer further includes, after the laser beam applying step, a transferring step of affixing an expandable sheet to the reverse side of the wafer and removing the protective member and the resin film from the face side of the wafer; and, after the transferring step, a dividing step of expanding the expandable sheet to divide the wafer along the modified layers into individual device chips.

Preferably, the wafer includes a plurality of devices formed in respective areas demarcated by the streets, each of the devices including a plurality of bumps. The method further includes, after the dividing step, an installing step of installing the device chips through the bumps.

Preferably, the resin film is free of a glue layer on a surface thereof that is disposed on the face side of the wafer.

Preferably, the laying step includes the step of integrally combining the resin film with the face side of the wafer in a vacuum mounting process.

According to the present invention, the curable resin is cured to provide a flat reference surface keeping the heightwise position of an upper surface of the wafer at a constant height free of height variations, and the focused point of the laser beam is positioned on the basis of the heightwise position of the upper surface, allowing the modified layers to be formed at positions free of positional variations.

In the transferring step, since the face side of the wafer is covered with the resin film, the curable resin will not be left as foreign matter on the face side of the wafer.

Since the curable resin is not left as foreign matter on the face side of the wafer, a bonding failure due to foreign matter deposited on the bumps is prevented from occurring.

In the transferring step, when the protective member and the resin film are removed from the face side of the wafer, no glue layer is left as foreign matter on the face side of the wafer.

It is possible to integrally combine the resin film free of a glue layer with the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
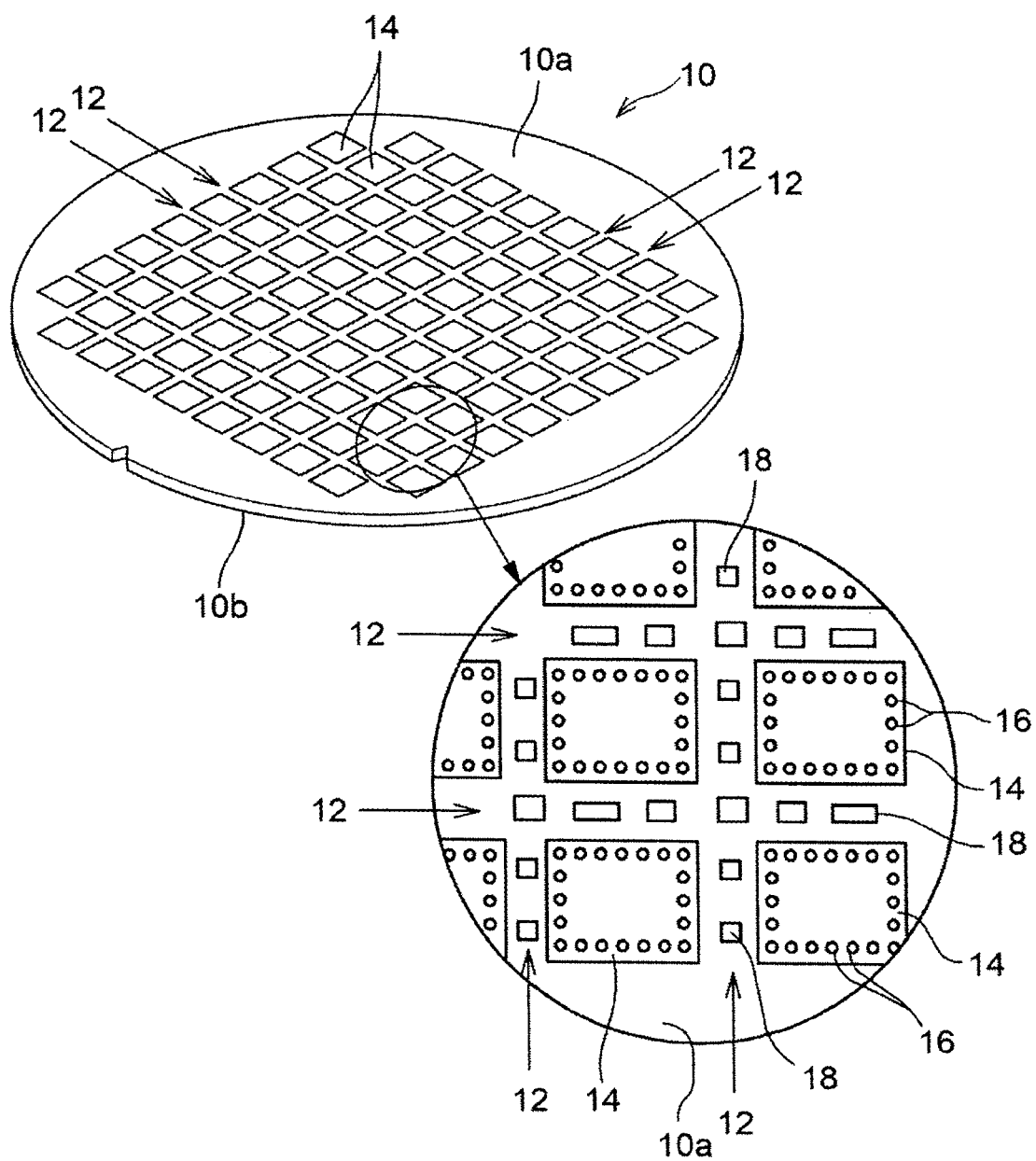
FIG. 1 is a perspective view illustrating a wafer as a workpiece by way of example.

A preferred embodiment of the present invention will be described hereinbelow with reference to the accompanying drawings. FIG. 1 illustrates a wafer to be processed by a method of processing a wafer according to the present embodiment. According to the present embodiment, the wafer, denoted by 10 in FIG. 1, includes a semiconductor wafer made of silicon as a base material. The wafer 10 that is shaped as a circular plate has a face side 10a where devices 14 such as integrated circuits (ICs) or large-scale integration (LSI) circuits are formed in respective areas demarcated by a grid of streets or projected dicing lines 12 established on the face side 10a. As illustrated in an enlarged inset of FIG. 1, a plurality of bumps or electrodes 16 protrude from the face side 10a of the wafer 10 in the peripheral region of each of the devices 14.

As also illustrated in the enlarged inset of FIG. 1, a plurality of TEGs 18 protrude from the face side 10a of the wafer 10 on some of the streets 12. The present invention is applicable not only to semiconductor wafers, but also to optical device wafers and various other wafers in different forms other than the form illustrated in FIG. 1.

Figure 2:
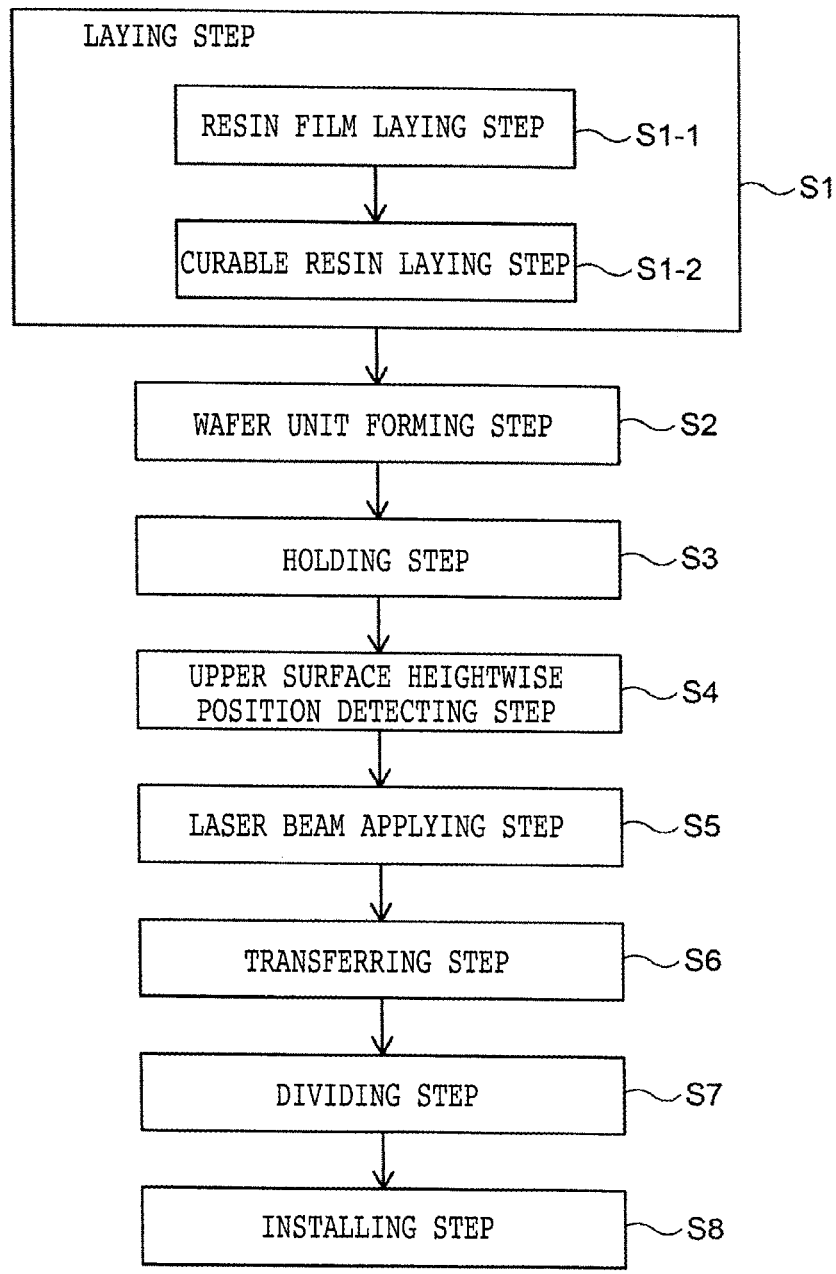
FIG. 2 is a flowchart of a method of processing a wafer according to an embodiment of the present invention.

A method of processing the wafer 10 having the TEGs 18 formed on some of the streets 12 with a laser beam while eliminating adverse effects imposed by the TEGs 18, etc. at the time the heightwise position of an upper surface of the reverse side of the wafer 10 is detected will be described. According to the present embodiment, the method includes steps that are successively carried out as illustrated by a flowchart of FIG. 2.

<Laying Step S1>

Figure 3A:
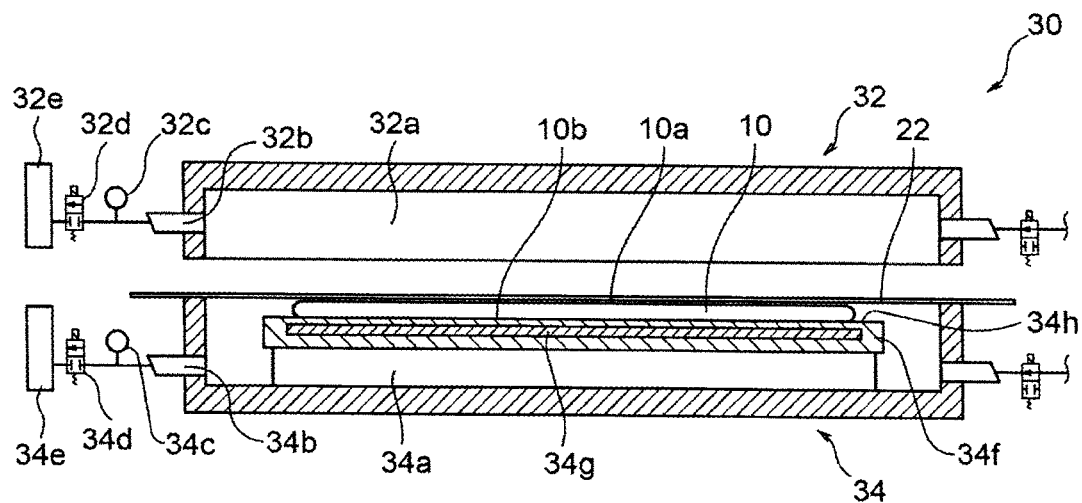
FIG. 3A is a cross-sectional view illustrating a configuration example of a vacuum mounting apparatus.
Figure 4:
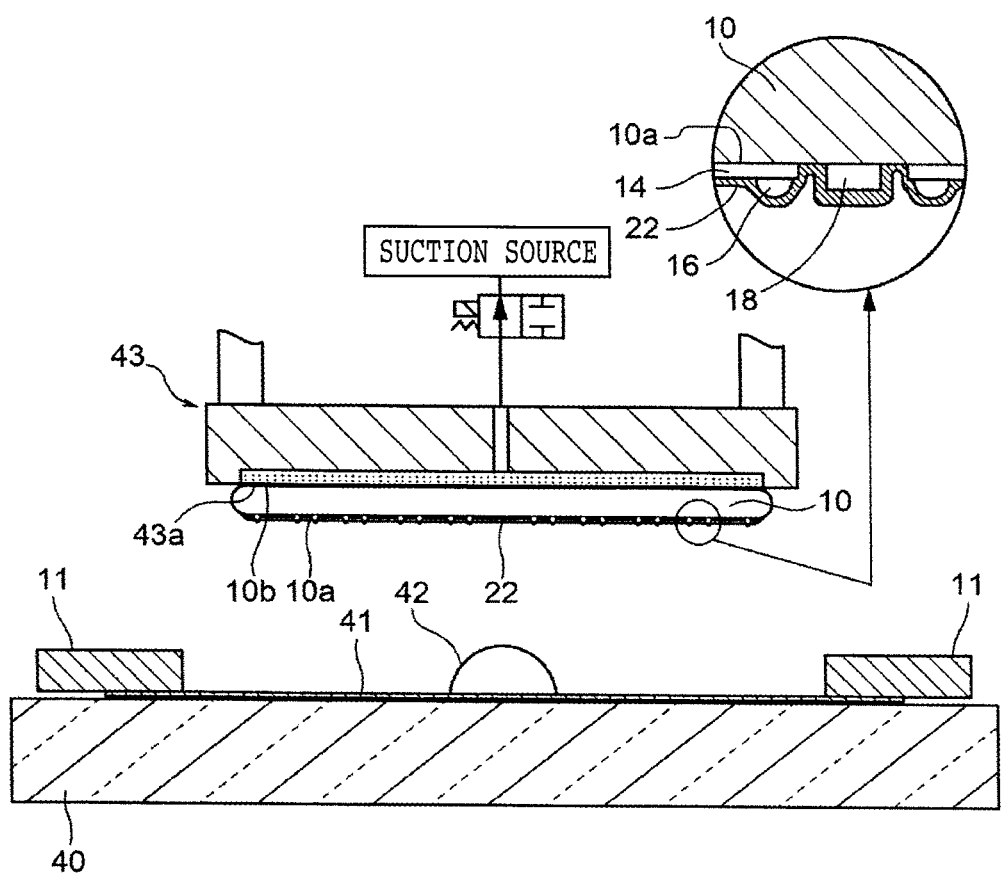
FIG. 4 is a cross-sectional view illustrating a curable resin laying step.

Laying step S1 includes resin film laying step S1-1 for covering the face side 10a of the wafer 10 with a resin film 22 (see FIG. 3A, etc.) free of a glue layer and curable resin laying step S1-2 for covering the resin film 22 with a curable resin 42 (see FIG. 4, etc.).

<Resin Film Laying Step S1-1>

Figure 3B:
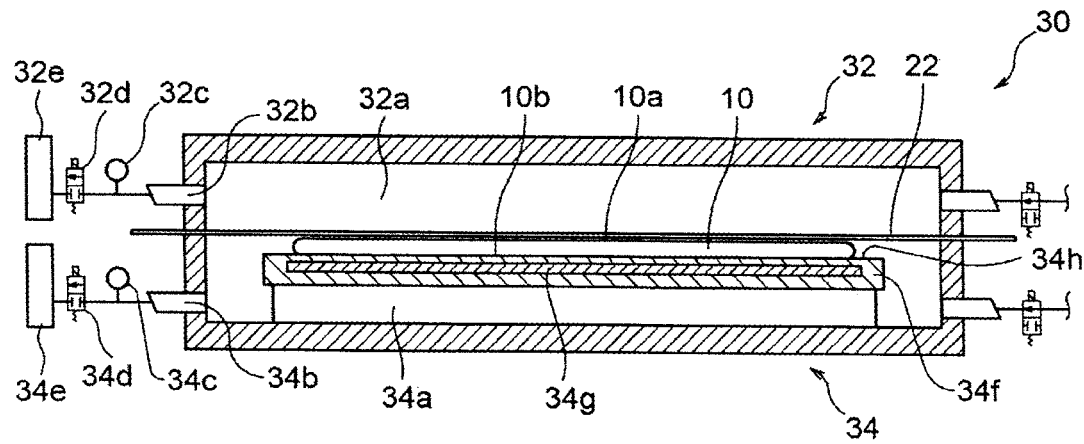
FIG. 3B is a cross-sectional view illustrating a resin film laying step.

As illustrated in FIGS. 3A and 3B, a vacuum mounting process is performed to cover the face side 10a of the wafer 10 with the resin film 22 and to integrally combine the resin film 22 with the face side 10a of the wafer 10 in a vacuum mounting process.

FIGS. 3A and 3B illustrate a vacuum mounting apparatus 30 having an upper casing 32 and a lower casing 34. The upper casing 32 has an upper inner space 32a defined therein, and the lower casing 34 has a lower inner space 34a defined therein. The upper casing 32 has an exhaust passage 32b that provides fluid communication between the exterior of the upper casing 32 and the upper inner space 32a within the upper casing 32. The exhaust passage 32b is connected to a suction source 32e through a barometer 32c and a control valve 32d.

The lower casing 34 has an exhaust passage 34b that provides fluid communication between the exterior of the lower casing 34 and the lower inner space 34a within the lower casing 34. The exhaust passage 34b is connected to a suction source 34e through a barometer 34c and a control valve 34d. The lower casing 34 houses a support table 34f disposed in the lower inner space 34a for supporting the wafer 10 thereon. The support table 34f incorporates therein a planar heater 34g for heating the wafer 10 that is supported on the support table 34f.

The resin film 22 free of a glue layer on its surface such that the resin film 22 does not adhere to the face side 10a of the wafer 10. Consequently, when the resin film 22 is peeled off from the wafer 10, no glue remains sticking to the surfaces of the devices 14 and the bumps 16 (see FIG. 1).

The resin film 22 may be made of any of various materials including, for example, polyethylene (PE), polyvinyl chloride (PVC), polyvinylidene chloride (PVDC), ethylene vinyl acetate (EVA), and so on. The resin film 22 may have a thickness ranging from 5 to 100 μm, for example, but is not limited to any particular thickness.

The vacuum mounting apparatus 30 is configured as described above. The vacuum mounting apparatus 30 operates in resin film laying step S1-1 as follows. As illustrated in FIG. 3A, a reverse side 10b of the wafer 10 is placed on a holding surface 34h of the support table 34f with the face side 10a thereof being exposed upwardly. As illustrated in FIG. 1, protrusions including the devices 14, the bumps 16, and the TEGs 18 are disposed on the face side 10a of the wafer 10.

Then, the resin film 22 is placed over the face side 10a of the wafer 10 in covering relation to the face side 10a in its entirety. The resin film 22 has a peripheral outer end portion extending radially outwardly beyond the wafer 10 and sticking out of the lower casing 34.

Then, as illustrated in FIG. 3B, the upper casing 32 is placed on the lower casing 34 such that they are integrally combined with each other, sandwiching the peripheral outer end portion of the resin film 22 therebetween. The upper inner space 32a in the upper casing 32 and the lower inner space 34a in the lower casing 34 face each other with the resin film 22 interposed therebetween and provide respective closed depressurization chambers or compartments.

Thereafter, the suction sources 32e and 34e are actuated and the control valves 32d and 34d are opened to evacuate the upper inner space 32a and the lower inner space 34a to predetermined pressures.

After the upper inner space 32a and the lower inner space 34a have been evacuated to the predetermined pressures, the control valve 32d is closed to stop depressurizing the upper inner space 32a, and the control valve 34d is left open to continuously depressurizing the lower inner space 34a, pressing the resin film 22 against the face side 10a of the wafer 10. The protrusions on the face side 10a of the wafer 10 are now pressed against the resin film 22, deforming the resin film 22 into a film having corresponding protrusions. After the upper inner space 32a and the lower inner space 34a have been evacuated to the predetermined pressures, the upper inner space 32a may alternatively be vented to the atmosphere to press the resin film 22 against the face side 10a of the wafer 10.

During the above process, the heater 34g may be energized to heat the wafer 10, softening the resin film 22 into intimate pressed contact with the protrusions on the face side 10a of the wafer 10.

Then, after elapse of a predetermined period of time, the upper inner space 32a and the lower inner space 34a are released from the depressurized state and introduce the atmospheric pressure therein. Then, the upper casing 32 is opened away from the lower casing 34, and the wafer 10 that has been integrally combined with the resin film 22 is removed from the lower casing 34. The extra portion of the resin film 22 that protrudes radially from the wafer 10 is severed off by a cutter or the like.

When resin film laying step S1-1 comes to an end, as illustrated in an enlarged inset of FIG. 4, the resin film 22 covers the entire face side 10a of the wafer 10 along the protrusions including the devices 14, the bumps 16, and the TEGs 18 that protrude from the face side 10a.

<Curable Resin Laying Step S1-2>

As illustrated in FIG. 4, curable resin laying step S1-2 is a step for covering the resin film 22 with a curable resin 42 that can be cured by an external stimulus such as ultraviolet rays. In curable resin laying step S1-2, a protective sheet 41 that is transmissive of ultraviolet rays is placed on a flat stage 40, and a predetermined amount of curable resin 42 is put on an upper surface of the protective sheet 41.

The curable resin 42 includes an ultraviolet-curable resin that can be cured when irradiated with ultraviolet rays as an external stimulus, as described later. The curable resin 42 may be a photocurable acrylic or epoxy resin, for example.

An acrylic resin is a (meth)acrylate and may be a (meth)acrylate having a urethane bond (urethane group) or a (meth)acrylate free of a urethane bond (urethane group).

A (meth)acrylate refers to an acrylate as an acrylic acid compound or a methacrylic acid compound. Specifically, a (meth)acrylate may be a tetrahydro-furfuryl acrylate, an isobornyl acrylate, a 1,9-nonanediol diacrylate, or the like, for example.

An epoxy resin is a resin having an epoxy group and may be a bisphenol A epoxy resin, an aliphatic epoxy resin (a dimer acid epoxy resin), or the like, for example.

The protective sheet 41 is made of the same resin as the curable resin 42, and should preferably be shaped as a sheet in advance. The protective sheet 41 may alternatively be made of polyethylene terephthalate (PET).

Then, as illustrated in FIG. 4, the reverse side 10b of the wafer 10 is held on a flat holding surface 43a of a holder 43 above the stage 40 with the resin film 22 facing downwardly toward the protective sheet 41. According to the present embodiment, the holder 43 holds the reverse side 10b of the wafer 10 under suction on the holding surface 43a. According to the present invention, however, the holder 43 is not limited to any particular holding configurations.

Figure 5:
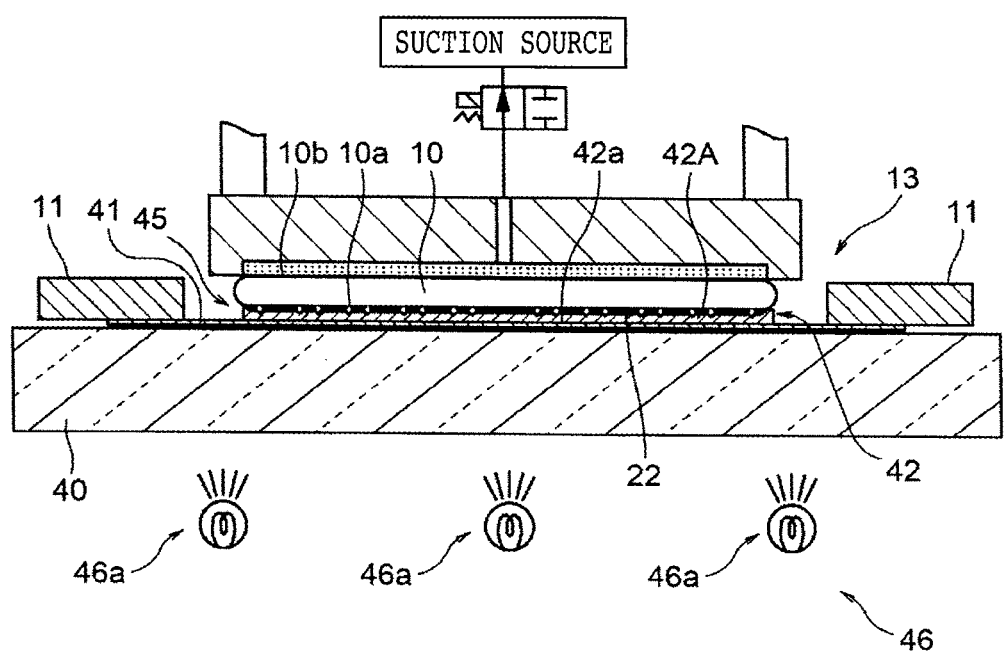
FIG. 5 is a cross-sectional view illustrating a wafer unit forming step.

Then, as illustrated in FIG. 5, the holder 43 is lowered to cause a lower surface of the resin film 22 to spread the curable resin 42 radially outwardly over the entire lower surface of the resin film 22. The spread curable resin 42 enters gaps between the protective sheet 41 and the resin film 22, filling crevices around the protrusions of the lower surface of the resin film 22.

<Wafer Unit Forming Step S2>

As illustrated in FIG. 5, wafer unit forming step S2 is a step for curing the curable resin 42 and making a wafer unit 13 in which the wafer 10 and an annular frame 11 are integrally combined with each other.

In wafer unit forming step S2, light sources 46a of a light applying unit 46 disposed below the stage 40 produce and apply ultraviolet rays through the stage 40, which is made of a transparent material, and the protective sheet 41 to the curable resin 42 on the wafer 10.

The transparent material of the stage 40 may be glass or the like. The light sources 46a of the light applying unit 46 may include light emitting diode (LED) lights, low-pressure mercury lamps, or the like for emitting ultraviolet rays having a predetermined wavelength.

According to the present embodiment, since the curable resin 42 includes an ultraviolet-curable resin, the light applying unit 46 for emitting ultraviolet rays as an external stimulus is used. However, if the curable resin 42 includes a thermosetting resin, a heater for emitting and applying heat as an external stimulus to the curable resin 42 may be used.

When the light sources 46a of the light applying unit 46 have applied ultraviolet rays to cure the curable resin 42, the resin film 22 and the curable resin 42 are integrally combined with each other. When the curable resin 42 is cured, the curable resin 42 is also integrally combined with the protective sheet 41. Inasmuch as the protective sheet 41 is made of the same resin as the curable resin 42 as described above, the curable resin 42 and the protective sheet 41 are firmly combined with each other and can be peeled off easily all together at a later time.

Figure 6:
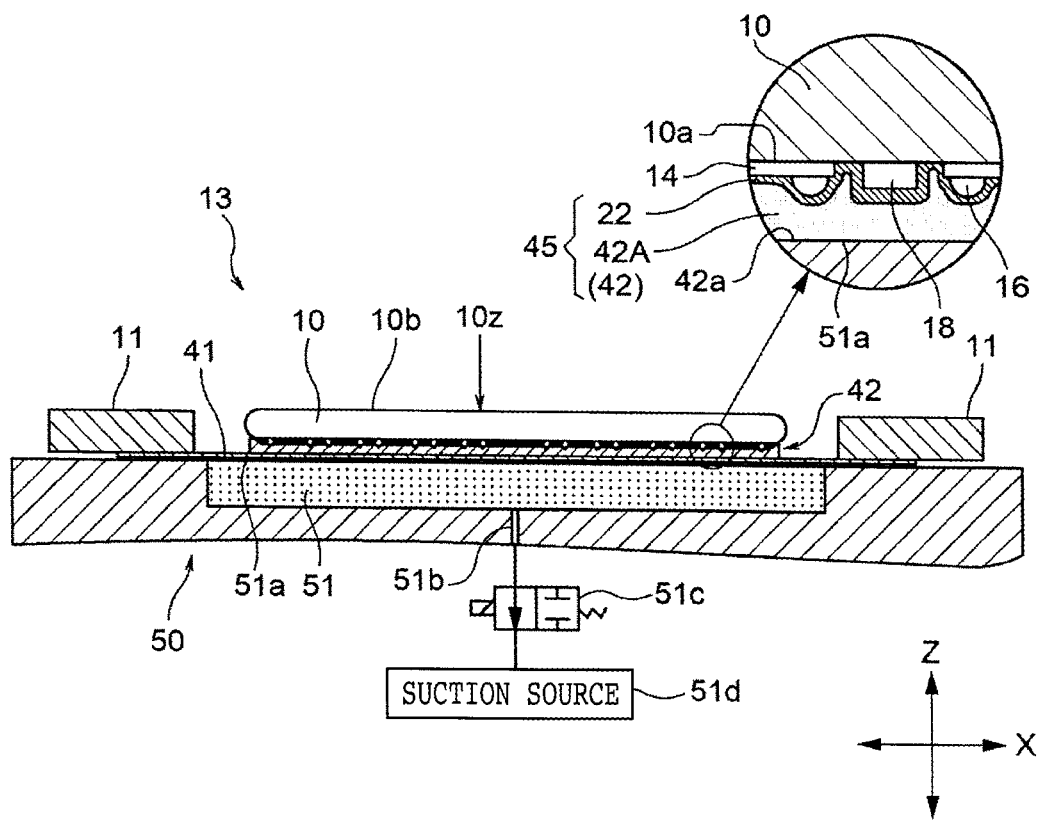
FIG. 6 is a cross-sectional view illustrating a holding step.

As illustrated in an enlarged inset of FIG. 6, when the curable resin 42 is cured, it is formed into a resin layer 42A having a lower surface as a flat reference surface 42a. The flat reference surface 42a thus formed keeps a heightwise position 10z of the upper surface of the wafer 10 at a constant height free of height variations.

As illustrated in the enlarged inset of FIG. 6, the resin layer 42A formed from the curable resin 42 and the protective sheet 41 jointly make up a protective member 45 that protects the face side 10a of the wafer 10.

Further, as illustrated in FIG. 5, the annular frame 11 is disposed on the protective sheet 41 around the wafer 10 and integrally combined with the protective sheet 41. The annular frame 11 may be integrally combined with the protective sheet 41 by being affixed to the protective sheet 41 through an adhesive layer formed on the protective sheet 41 or through a sticky layer formed on the protective sheet 41 in an area where the annular frame 11 is placed.

The annular frame 11 may be placed on the protective sheet 41 in curable resin laying step S1-2 prior to wafer unit forming step S2.

<Holding Step S3>

As illustrated in FIG. 6, holding step S3 is a step for holding the protective sheet 41 of the wafer unit 13 on a holding table 50.

The holding table 50 is included in a laser processing apparatus and can be processing-fed in X-axis directions. The holding table 50 has a porous plate 51 having an upper surface as a holding surface 51a and a suction channel 51b held in fluid communication with the porous plate 51. The suction channel 51b is connected through a valve 51c to a suction source 51d.

The wafer 10 is placed on the holding surface 51a of the porous plate 51 with the protective sheet 41, the curable resin 42, i.e., the cured resin layer 42A, and the resin film 22 interposed therebetween. When the suction source 51d is actuated and the valve 51c is opened, a negative pressure from the suction source 51d acts through the valve 51c and the suction channel 51b on the porous plate 51 and hence the wafer 10, holding the wafer 10 under suction on the holding table 50 with the reverse side 10b exposed upwardly.

The exposed reverse side 10b of the wafer 10 has a heightwise position at the heightwise position 10z of the upper surface of the wafer 10. Since the protrusions on the face side 10a of the wafer 10 are embedded in the cured resin layer 42A providing the flat reference surface 42a, the heightwise position 10z of the upper surface of the wafer 10 is kept at a constant height free of height variations.

<Upper Surface Heightwise Position Detecting Step S4>

Figure 7:
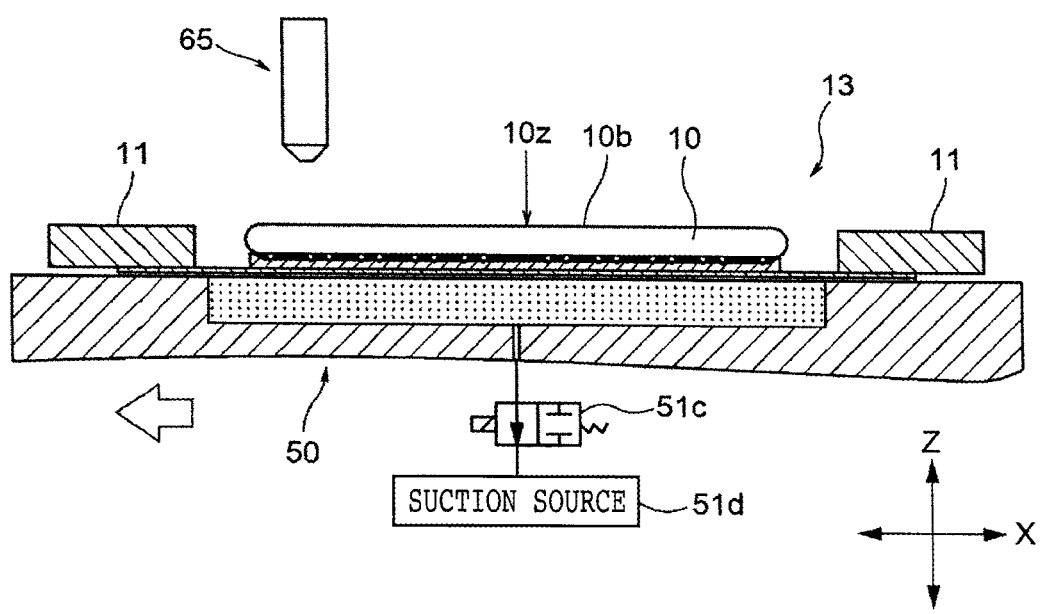
FIG. 7 is a cross-sectional view illustrating an upper surface heightwise position detecting step.

As illustrated in FIG. 7, upper surface heightwise position detecting step S4 is a step for detecting the heightwise position 10z of the upper surface of the reverse side 10b of the wafer 10 at a street.

As illustrated in FIG. 7, the holding table 50 is moved in a first direction on a forward route along one of the X-axis directions, and the upper surface heightwise position 10z is continuously measured by scanning the reverse side 10b of the wafer 10 along the street 12 (see FIG. 1).

Figure 8:
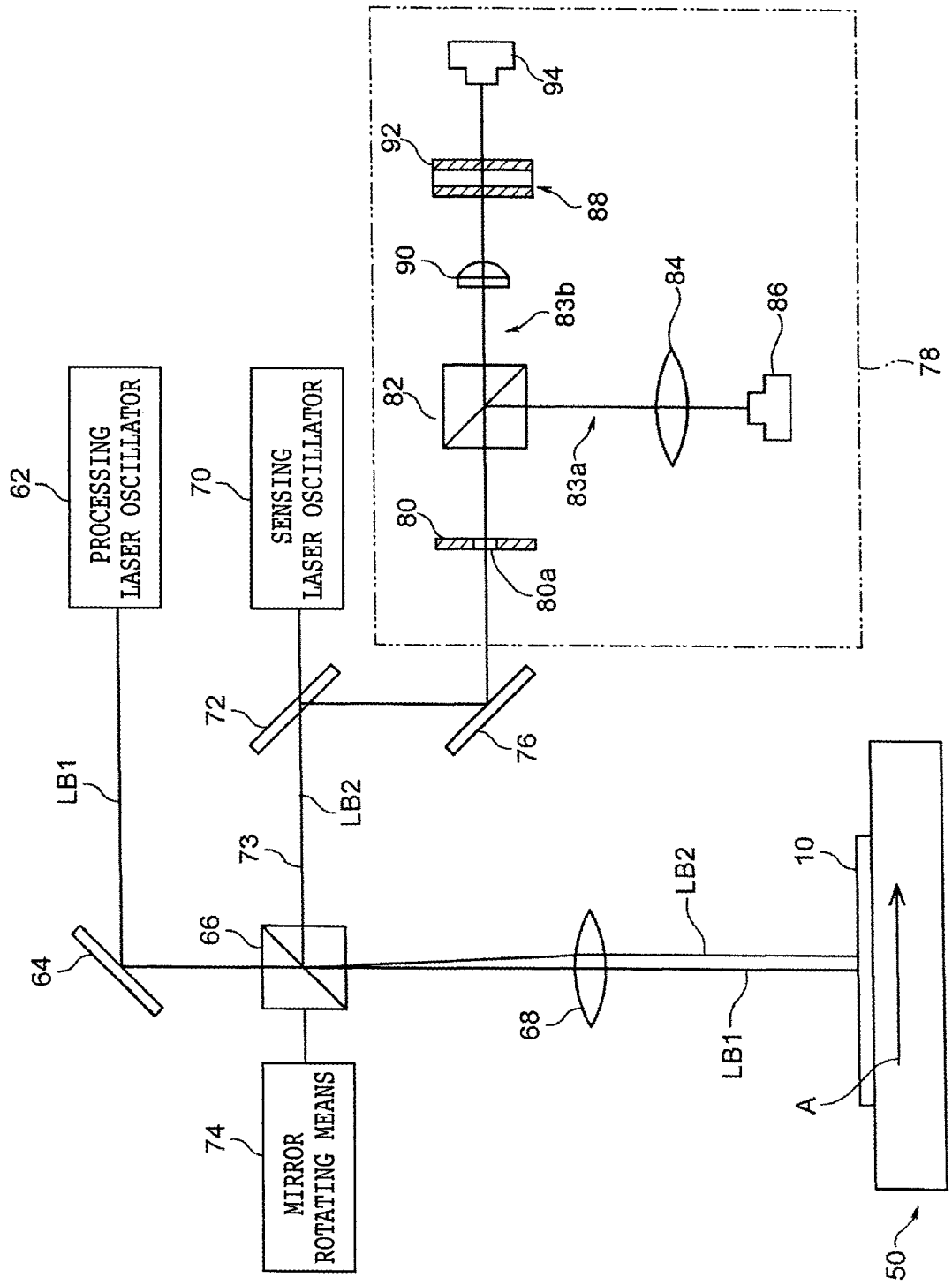
FIG. 8 is a view illustrating a configuration example of an optical system of a laser processing apparatus.

The upper surface heightwise position 10z (see FIG. 7) can be detected by an optical system of a laser processing apparatus illustrated in FIG. 8, for example. As illustrated in FIG. 8, the optical system includes a processing laser oscillator 62 for emitting a processing laser beam LB1 having a wavelength transmittable through the wafer 10 as a workpiece and a sensing laser oscillator 70 for emitting a sensing laser beam LB2 for detecting upper surface heightwise position 10z (see FIG. 7).

The sensing laser oscillator 70 includes an He—Ne laser oscillator, for example, and emits the sensing laser beam LB2 that has a wavelength of 633 nm, an output power of 10 mW, and a beam diameter of 1.0 mm, for example.

The sensing laser beam LB2 emitted from the sensing laser oscillator 70 is applied to a half-silvered mirror 72 that passes part of the sensing laser beam LB2 therethrough. The sensing laser beam LB2 that has traveled through the half-silvered mirror 72 is reflected by a dichroic mirror 66 and then applied to a condensing lens 68 of a beam condenser 36. The dichroic mirror 66 is rotatable about an axis perpendicular to the sheet of FIG. 8 by mirror rotating means 74 including a piezoelectric device or the like, for example.

In FIG. 8, the dichroic mirror 66 is rotated counterclockwise to have a reflecting surface thereof tilted a negative 0.14 degree from 45 degrees with respect to an optical path 73 of the sensing laser beam LB2.

In a case where the condensing lens 68 has a focal length of 200 mm and the distance from the dichroic mirror 66 to the condensing lens 68 and the distance from the condensing lens 68 to the wafer 10 are equal to each other, the sensing laser beam LB2 can be applied to the wafer 10 at a location that is 0.5 mm ahead of a location where the processing laser beam LB1 is applied to the wafer 10 in a processing direction indicated by an arrow A.

The sensing laser beam LB2 applied to the reverse side 10b of the wafer 10 is reflected therefrom as a reflected sensing laser beam. The reflected sensing laser beam passes through the condensing lens 68 and is reflected by the dichroic mirror 66 toward the half-silvered mirror 72. Part of the reflected sensing laser beam applied to the half-silvered mirror 72 is reflected by the half-silvered mirror 72 and then reflected by a mirror 76 toward a heightwise position detector 78.

When the reflected sensing laser beam enters the heightwise position detector 78, it passes through a pinhole 80a in a pinhole mask 80 and is applied to a beam splitter 82. The reflected sensing laser beam is divided by the beam splitter 82 into a reflected sensing laser beam traveling along a first optical path 83a and a reflected sensing laser beam traveling along a second optical path 83b.

The reflected sensing laser beam traveling along the first optical path 83a is converged 100% by a condensing lens 84 and detected by a first photodetector device 86. The first photodetector device 86 generates and outputs a voltage signal commensurate with the detected amount of the reflected sensing laser beam to a controller, not depicted.

The reflected sensing laser beam traveling along the second optical path 83b is converged one-dimensionally by a cylindrical lens 90 of detected area limiting means 88 and then limited to a predetermined unit length by a one-dimensional mask 92 thereof before being detected by a second photodetector device 94. The second photodetector device 94 generates and outputs a voltage signal commensurate with the detected amount of the reflected sensing laser beam to the controller, not depicted.

The relation between the amounts of the reflected laser beams detected by the first photodetector device 86 and the second photodetector device 94 will be described below. The amount of the reflected sensing laser beam detected by the first photodetector device 86 is constant as it is converged 100% by the condensing lens 84, and the first photodetector device 86 outputs a constant voltage value V1 of 10 V, for example.

On the other hand, the amount of the reflected sensing laser beam to be detected by the second photodetector device 94 is converged one-dimensionally by the cylindrical lens 90 and then limited to the predetermined unit length by the one-dimensional mask 92 thereof before it is detected by the second photodetector device 94.

Figure 9A:
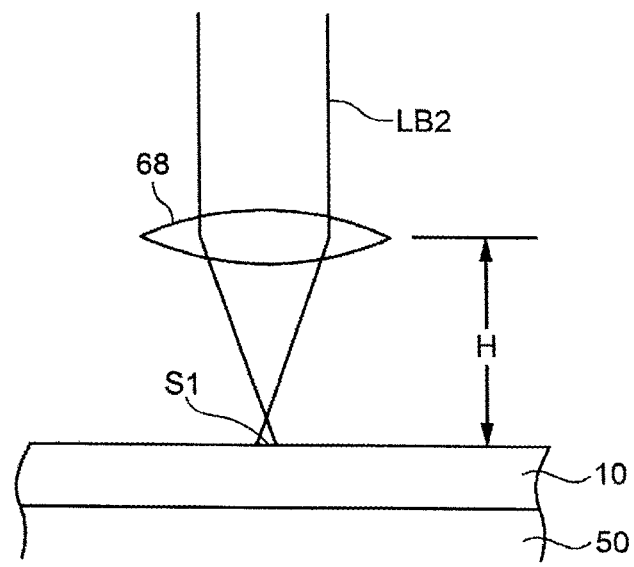
FIGS. 9A and 9B are schematic views that are illustrative of the difference between laser beam spots formed on wafers at different heightwise positions.
Figure 9B:
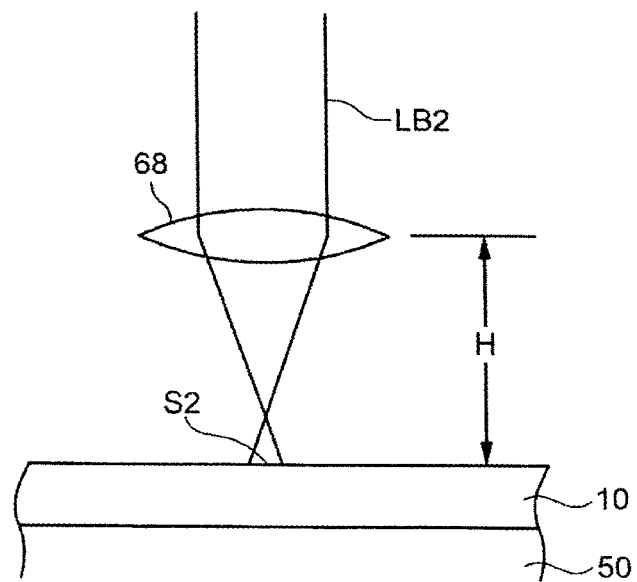

When the sensing laser beam LB2 is applied to the upper surface of the wafer 10 as illustrated in FIGS. 9A and 9B, the amount of the reflected sensing laser beam to be detected by the second photodetector device 94 varies depending on the distance from the condensing lens 68 of the beam condenser 36 to the upper surface of the wafer 10, i.e., the heightwise position of the wafer 10. Therefore, the second photodetector device 94 outputs a voltage value V2 that is variable depending on the heightwise position of the upper surface of the wafer 10 that is irradiated with the sensing laser beam LB2.

For example, as illustrated in FIG. 9A, if the heightwise position of the wafer 10 is higher and a distance H from the condensing lens 68 to the upper surface of the wafer 10 is smaller, then the sensing laser beam LB2 applied to the upper surface of the wafer 10 is reflected from a smaller spot S1 on the upper surface of the wafer 10 that is irradiated with the sensing laser beam LB2.

As described above, the reflected sensing laser beam from the spot S1 is divided by the beam splitter 82 into a reflected sensing laser beam traveling along the first optical path 83*a* and a reflected sensing laser beam traveling along the second optical path 83*b*. Since the reflected sensing laser beam from the spot S1 that travels along the first optical path 83*a* is converged 100% by the condensing lens 84, the amount of the reflected sensing laser beam that travels along the first optical path 83*a* is detected in its entirety by the first photodetector device 86.

On the other hand, since the reflected sensing laser beam from the spot S1 that travels along the second optical path 83*b* is converged one-dimensionally by the cylindrical lens 90, the reflected sensing laser beam converged by the cylindrical lens 90 has a substantially rectangular cross-sectional shape.

The reflected sensing laser beam that has been constricted to the substantially rectangular cross-sectional shape is limited to the predetermined unit length by the one-dimensional mask 92, so that part of the reflected sensing laser beam that travels along the second optical path 83*b* is detected by the second photodetector device 94. Therefore, the amount of the reflected sensing laser beam detected by the second photodetector device 94 is smaller than the amount of the reflected sensing laser beam detected by the first photodetector device 86.

As illustrated in FIG. 9B, if the heightwise position of the wafer 10 is lower and the distance H from the condensing lens 68 to the upper surface of the wafer 10 is larger, then the sensing laser beam LB2 applied to the upper surface of the wafer 10 is reflected from a larger spot S2 on the upper surface of the wafer 10 that is irradiated with the sensing laser beam LB2. The spot S2 is larger than the spot S1 illustrated in FIG. 9A.

The reflected sensing laser beam from the spot S2 is divided by the beam splitter 82 into a reflected sensing laser beam traveling along the first optical path 83*a* and a reflected sensing laser beam traveling along the second optical path 83*b*. Since the reflected sensing laser beam from the spot S2 that travels along the first optical path 83*a* is converged 100% by the condensing lens 84, the amount of the reflected sensing laser beam that travels along the first optical path 83*a* is detected in its entirety by the first photodetector device 86.

On the other hand, since the reflected sensing laser beam from the spot S2 that travels along the second optical path 83*b* is converged one-dimensionally by the cylindrical lens 90, the reflected sensing laser beam converged by the cylindrical lens 90 has a substantially rectangular cross-sectional shape. The length of a longer side of the substantially rectangular cross-sectional shape of the reflected sensing laser beam from the spot S2 is larger than the length of a longer side of the substantially rectangular cross-sectional shape of the reflected sensing laser beam from the spot S1 because the spot S2 is larger than the spot S1.

The reflected sensing laser beam that has been constricted to the substantially rectangular cross-sectional shape is limited to the predetermined unit length by the one-dimensional mask 92, so that part of the reflected sensing laser beam that travels along the second optical path 83*b* is detected by the second photodetector device 94. Therefore, the amount of the reflected sensing laser beam detected by the second photodetector device 94 is smaller than the amount of the reflected sensing laser beam from the spot S1 illustrated in FIG. 9A.

The amount of the reflected sensing laser beam detected by the second photodetector device 94 is larger as the distance H from the condensing lens 68 to the upper surface of the wafer 10 is smaller, i.e., as the heightwise position of the wafer 10 is higher, and is smaller as the distance H from the condensing lens 68 to the upper surface of the wafer 10 is larger, i.e., as the heightwise position of the wafer 10 is lower.

The relation between the ratio of the voltage value V1 output from the first photodetector device 86 to the voltage value V2 output from the second photodetector device 94 and the distance H from the condensing lens 68 to the upper surface of the wafer 10, i.e., the heightwise position of the wafer 10, will be described below with reference to a map illustrated in FIG. 10.

Figure 10:
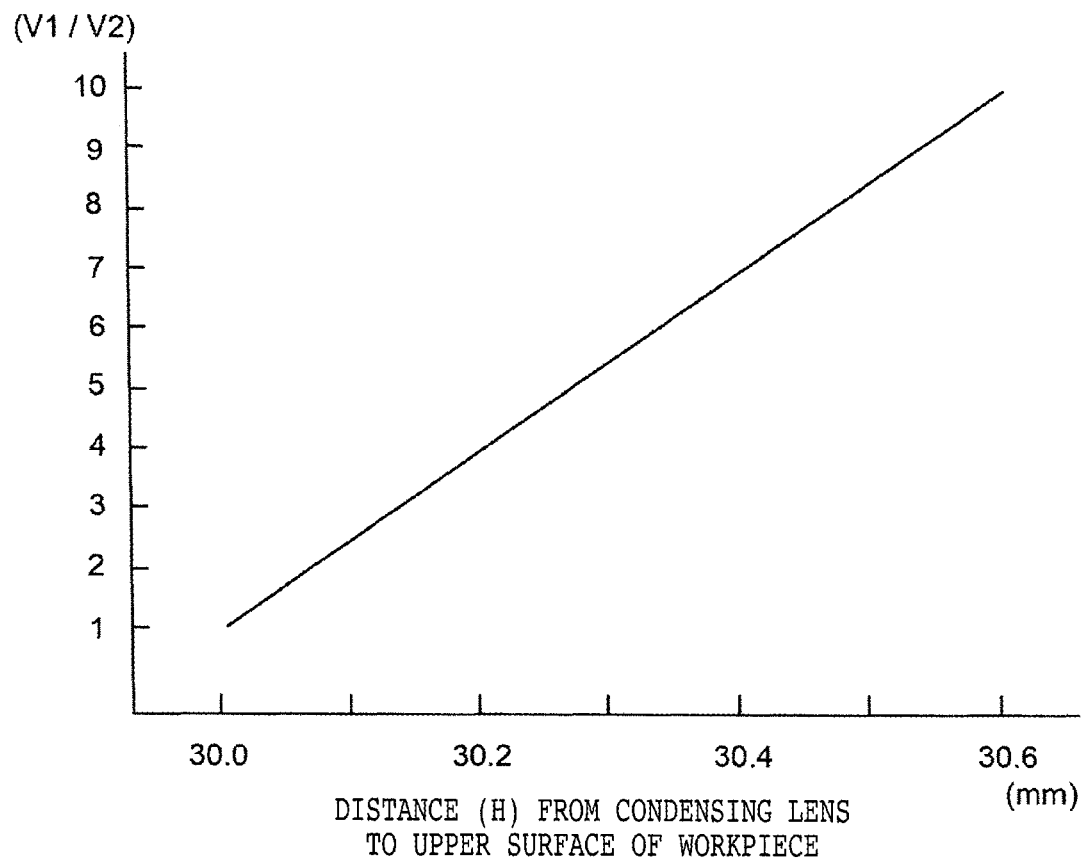
FIG. 10 is a diagram illustrating a map representing the relation between the ratio (V1/V2) of voltage values V1 output from a first photodetector device and voltage values V2 output from a second photodetector device and the distances from a condensing lens to an upper surface of a wafer.

In FIG. 10, the horizontal axis represents the distance H from the condensing lens 68 to the upper surface of the wafer 10, and the vertical axis represents the ratio (V1/V2) of the voltage value V1 output from the first photodetector device 86 to the voltage value V2 output from the second photodetector device 94.

The map illustrated in FIG. 10 is configured such that when the distance H from the condensing lens 68 to the upper surface of the wafer 10 is 30.0 mm, the ratio (V1/V2) of the voltage value V1 to the voltage value V2 is 1, and when the distance H from the condensing lens 68 to the upper surface of the wafer 10 is 30.6 mm, the ratio (V1/V2) of the voltage value V1 to the voltage value V2 is 10.

The controller, not depicted, determines the ratio (V1/V2) of the voltage value V1 output from the first photodetector device 86 to the voltage value V2 output from the second photodetector device 94, checks the determined ratio (V1/V2) against the map illustrated in FIG. 10, and determines from the map the distance H from the condensing lens 68 to the upper surface of the wafer 10. The map illustrated in FIG. 10 is stored in a read only memory (ROM) of the controller, not depicted.

The sensing laser beam LB2 that is applied through the condensing lens 67 to the wafer 10 and the heightwise position detector 78 jointly make up detecting means for detecting the heightwise position of the upper surface of the wafer 10. The detecting means can thus detect the heightwise position 10*z* (see FIG. 7) of the upper surface of the wafer 10.

<Laser Beam Applying Step S5>

Laser beam applying step S5 is a step for applying the processing laser beam LB1 having a wavelength transmittable through the wafer 10 to the wafer 10 from the reverse side 10*b* along one of the streets 12 (see FIG. 1) thereon while positioning a focused point of the processing laser beam LB1 within the wafer 10 on the basis of the heightwise position 10*z* of the upper surface of the wafer 10, thereby forming modified layers in the wafer 10 along the street 12.

Figure 11:
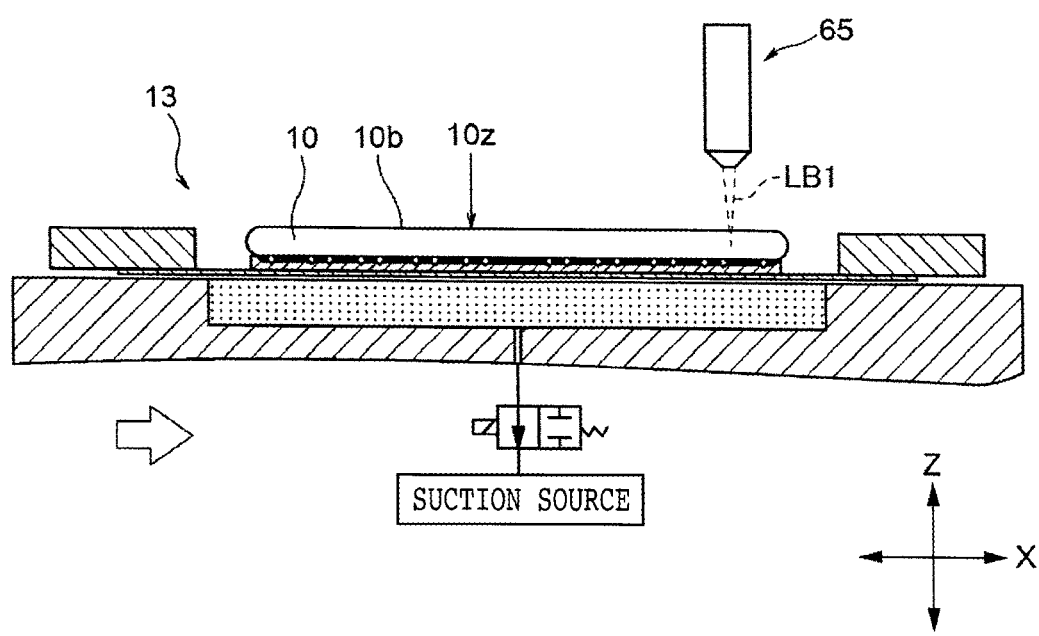
FIG. 11 is a cross-sectional view illustrating a laser beam applying step.

Specifically, after the holding table 50 has been moved in the first direction on the forward route along one of the X-axis directions and the upper surface heightwise position 10*z* has been detected in upper surface heightwise position detecting step S4, as illustrated in FIG. 7, the processing laser beam LB1 is applied to the wafer 10 while the moving the holding table 50 is being moved in a second direction on a rearward route along the other of the X-axis directions and the height of the focused point of the processing laser beam LB1 is being moved along the Z-axis directions in a manner to follow the detected upper surface heightwise position 10*z*, as illustrated in FIG. 11.

The processing laser beam LB1 is applied by the optical system of the laser processing apparatus illustrated in FIG. 8. The processing laser oscillator 62 illustrated in FIG. 8 includes a YVO4 pulse laser oscillator or a YAG pulse laser oscillator for emitting the processing laser beam LB1 that has a wavelength of 1064 nm, for example.

The processing laser beam LB1 emitted from the processing laser oscillator 62 is reflected by a mirror 64 and transmitted through the dichroic mirror 66. The processing laser beam LB1 transmitted through the dichroic mirror 66 falls on the condensing lens 68 that acts as an objective lens perpendicularly to the condensing lens 68, i.e., parallel to the optical axis of the condensing lens 68. The processing laser beam LB1 is applied by the condensing lens 68 to the wafer 10 along one of the streets with its focused point positioned within the wafer 10, successively forming modified layers in the wafer 10 along the street.

<Transferring Step S6>

Transferring step S6 is a step for, as illustrated in FIGS. 12A through 12D, affixing an expandable sheet 19 to the reverse side 10b of the wafer 10 and removing the protective member 45 and the resin film 22 from the face side 10a of the wafer 10.

Figure 12A:
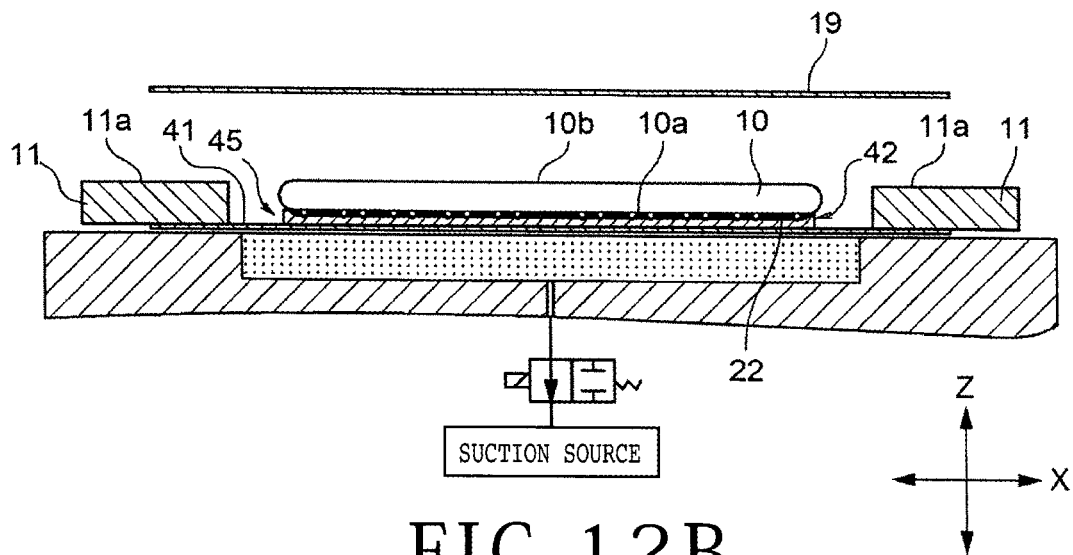
FIG. 12A is a cross-sectional view illustrating an expandable sheet.
Figure 12B:
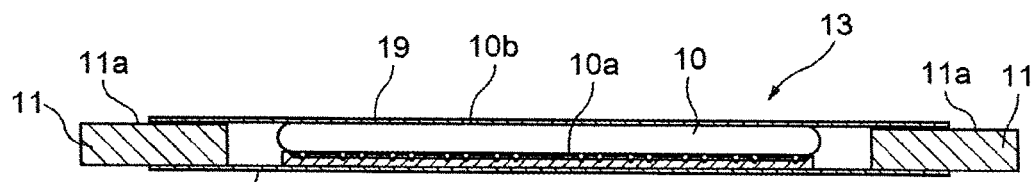
FIG. 12B is a cross-sectional view that is illustrative of the manner in which the expandable sheet is affixed.

Specifically, as illustrated in FIGS. 12A and 12B, the expandable sheet 19 that has a sticky layer is affixed to the reverse side 10b of the wafer 10. The expandable sheet 19 is also affixed to an upper surface 11a of the annular frame 11.

Figure 12C:
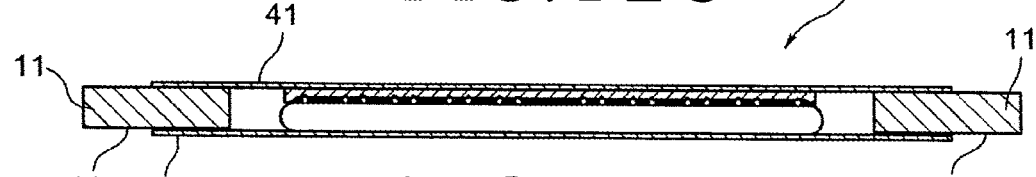
FIG. 12C is a cross-sectional view illustrating a wafer unit that has been inverted upside down.
Figure 12D:
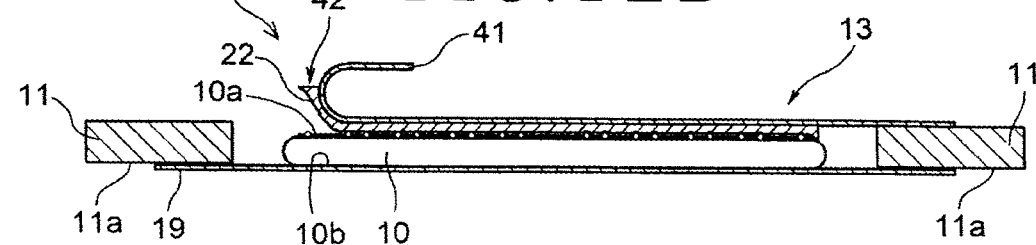
FIG. 12D is a cross-sectional view that is illustrative of the manner in which a protective member and a resin film are removed.

Then, as illustrated in FIG. 12C, the wafer unit 13 is inverted upside down to position the protective sheet 41 on the upper side. As illustrated in FIG. 12D, the protective sheet 41 starts being peeled off from the annular frame 11. When the protective sheet 41 then starts being peeled off from the wafer 10, the curable resin 42, i.e., the resin layer 42A, and the resin film 22 as well as the protective sheet 41 are peeled off from the face side 10a of the wafer 10.

Figure 13:
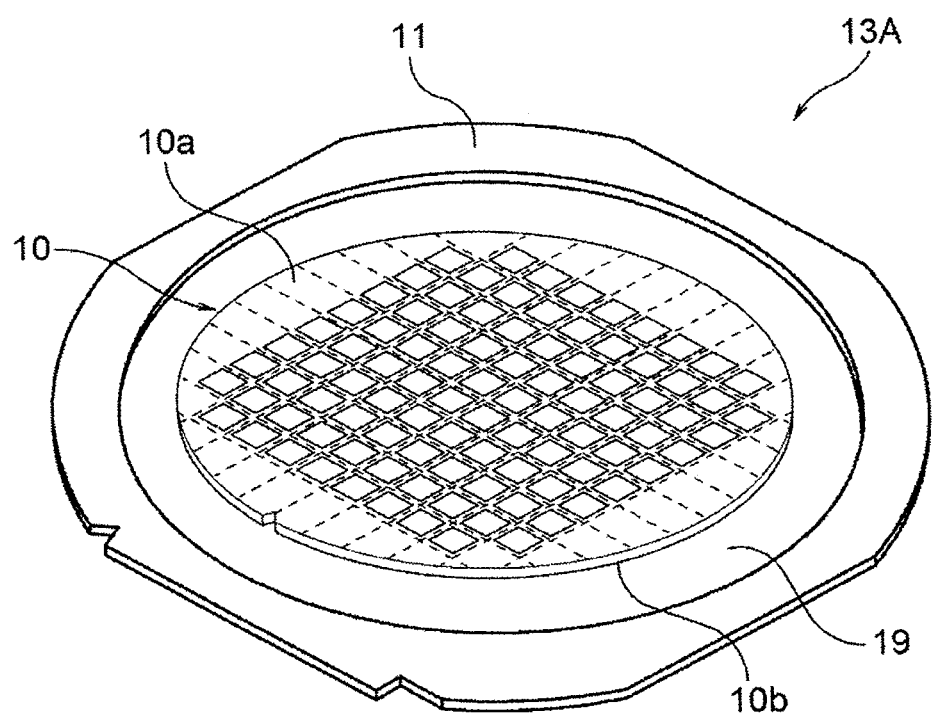
FIG. 13 is a perspective view of a wafer unit to which a wafer has been transferred.

As illustrated in FIG. 13, there is now provided a wafer unit 13A in which the wafer 10 and the annular frame 11 have been transferred to the expandable sheet 19 with the face side 10a of the wafer 10 being exposed.

In transferring step S6 described above, since the face side 10a of the wafer 10 is covered with the resin film 22, the curable resin 42 will not be left on the face side 10a of the wafer 10. Further, as no glue layer exists on the resin film 22, the resin film 22 can easily be peeled off from the wafer 10, preventing foreign matter from being left on the face side 10a of the wafer 10. The above sequence of transferring step S6 can be automatically carried out by an apparatus that is not limited to any particular specific configuration.

<Dividing Step S7>

Figure 14A:
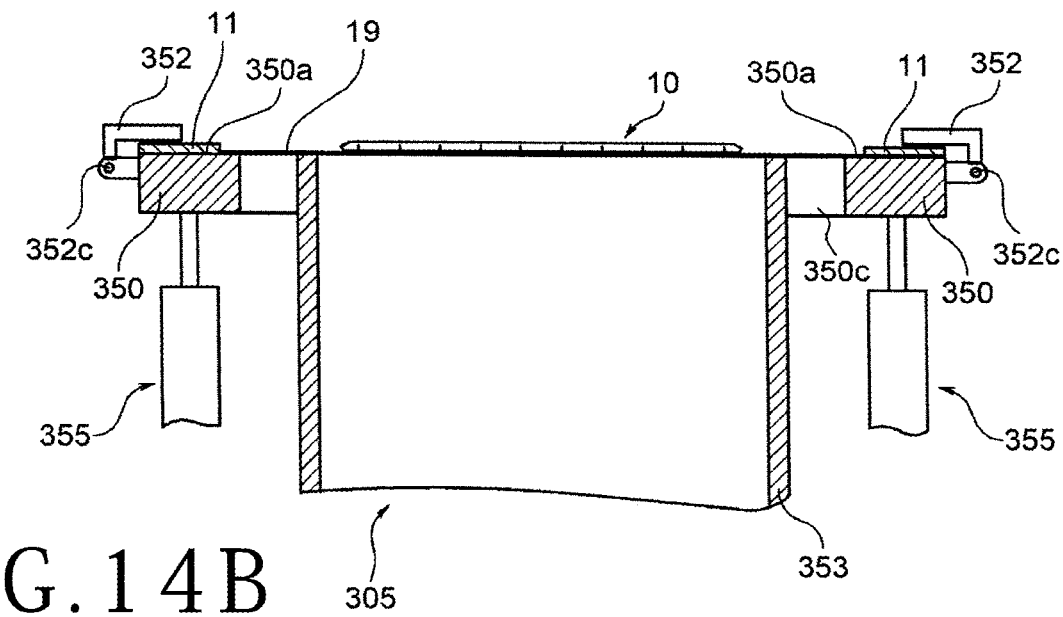
FIG. 14A is a cross-sectional view illustrating the wafer unit that has been set in a dividing step.
Figure 14B:
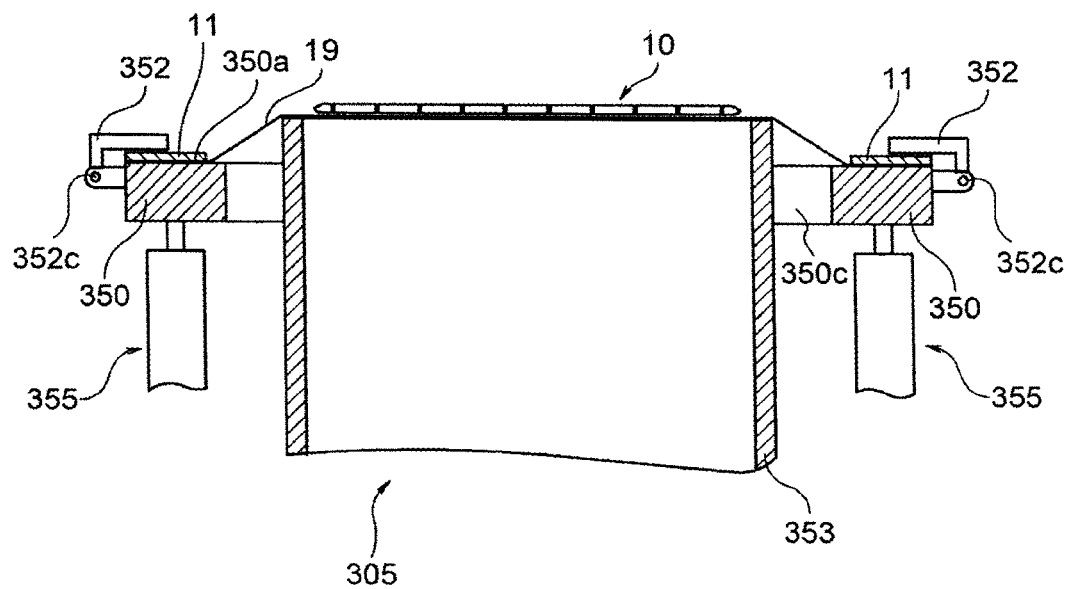
FIG. 14B is a is a cross-sectional view illustrating the wafer unit that has been divided into individual device chips in the dividing step.

Dividing step S7 is a step for, as illustrated in FIGS. 14A and 14B, expanding the expandable sheet 19 to divide the wafer 10 along the modified layers into individual device chips.

FIG. 14A illustrates a configuration example of an expanding apparatus 305 for carrying out dividing step S7. The expanding apparatus 305 includes an annular table 350 that is larger in diameter than the expandable sheet 19. The annular table 350 has a circular opening 350c defined therein that is smaller in diameter than the expandable sheet 19. A plurality of fastening clamps 352 are disposed at equal angular intervals on an outer circumferential portion of the annular table 350. The fastening clamps 352 are angularly movable about respective pivot shafts 352c and are normally loaded by springs or the like to grip the annular frame 11 between an annular holding surface 350a of the annular table 350 and respective lower surfaces of the fastening clamps 352. The annular table 350 is vertically movable by annular table lifting and lowering means 355 that may include an air cylinder or the like, for example.

A hollow cylindrical expanding drum 353 is disposed in the opening 350c in the annular table 350 and has its heightwise position fixed. The annular table 350 and the expanding drum 353 have respective vertical central axes held in substantially central alignment with each other. The expanding drum 353 has an outside diameter larger than the diameter of the wafer 10.

The expanding apparatus 305 that has the above configuration operates as follows. First, as illustrated in FIG. 14A, the annular frame 11 is placed on the annular holding surface 350a of the annular table 350 that is positioned in a reference heightwise position, and gripped in position by the fastening clamps 352. At this time, the expanding drum 353 has an upper end face held in abutment against a lower surface of the expandable sheet 19 in a region thereof between an inner circumferential edge of the annular frame 11 and an outer circumferential edge of the wafer 10.

Then, as illustrated in FIG. 14B, the annular table lifting and lowering means 355 lowers the annular table 350, moving the annular frame 11 downwardly from the upper end face of the expanding drum 353. The expandable sheet 19 is relatively pushed upwardly by the upper end face of the expanding drum 353 and expanded radially outwardly.

External forces, i.e., expanding forces, are now applied through the expandable sheet 19 intensively to the modified layers in the wafer 10, breaking the modified layers and dividing the wafer 10 into individual device chips along the streets where the modified layers are present in the wafer 10.

<Installing Step S8>

Installing step S8 is a step for, after dividing step S7, installing the device chips on circuits through the bumps included in the devices. Since no foreign matter is left on the surfaces of the device chips produced in dividing step S7, no foreign matter is deposited on the bumps and hence a bonding failure is prevented from occurring when the bumps are bonded to the circuits.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer having a plurality of intersecting streets on a face side thereof with protrusions on the streets, the method comprising:
   a laying step of laying the face side of the wafer on a curable resin of a protective member including a protective sheet and the curable resin disposed on the protective sheet and curable by an external stimulus, with a resin film interposed between the face side of the wafer and the curable resin, embedding the protrusions on the face side of the wafer in the curable resin, to thereby render a reverse side of the wafer flat;
   after the laying step, a wafer unit forming step of applying an external stimulus to the curable resin to cure the curable resin into a cured resin layer, thereby forming a wafer unit including the protective sheet, the cured resin layer on the protective sheet, the resin film on the cured resin layer, and the wafer disposed on the resin film with the reverse side of the wafer being exposed;
   a holding step of holding the protective sheet of the wafer unit on a holding table;
   after the holding step, an upper surface heightwise position detecting step of detecting a heightwise position of an upper surface of the reverse side of the wafer along the streets; and a laser beam applying step of applying a laser beam having a wavelength transmittable through the wafer to the wafer from the reverse side thereof along the streets while positioning a focused point of the laser beam within the wafer on a basis of the heightwise position detected in the upper surface heightwise position detecting step, to thereby form modified layers in the wafer along the streets.

2. The method of processing a wafer according to claim 1, further comprising:
   after the laser beam applying step, a transferring step of affixing an expandable sheet to the reverse side of the wafer and removing the protective member and the resin film from the face side of the wafer; and,
   after the transferring step, a dividing step of expanding the expandable sheet to divide the wafer along the modified layers into individual device chips.

3. The method of processing a wafer according to claim 2,
   the wafer including a plurality of devices formed in respective areas demarcated by the streets, each of the devices including a plurality of bumps,
   the method further comprising:
   after the dividing step, an installing step of installing the device chips on circuits through the bumps.

4. The method of processing a wafer according to claim 1, wherein the resin film is free of a glue layer on a surface thereof that is disposed on the face side of the wafer.

5. The method of processing a wafer according to claim 4, wherein the laying step includes the step of integrally combining the resin film with the face side of the wafer in a vacuum mounting process.

6. The method of processing a wafer according to claim 4,
   wherein the wafer has a plurality of devices disposed on the face side thereof, the devices having a plurality of bumps thereon protruding from the face side of the wafer; and
   wherein when the resin film is peeled off from the wafer, no glue remains sticking to the surfaces of the devices and the bumps.

7. The method of processing a wafer according to claim 1, wherein the resin film has a thickness ranging from 5 to 100 μm.

8. The method of processing a wafer according to claim 1, wherein the protrusions on the streets are test element groups (TEGs).

9. The method of processing a wafer according to claim 1, wherein the wafer has a small thickness of 50 μm or less.

10. A method of processing a wafer having a plurality of intersecting streets on a face side thereof with protrusions on the streets, the method comprising:
    laying a resin film on the face side of the wafer, wherein the resin film covers the protrusions on the streets and deforms such that the resin film has corresponding protrusions;
    covering the resin film with a curable resin, the curable resin curable by an external stimulus, wherein the protrusions on the resin film are embedded in the curable resin, wherein a protective sheet contacts the curable resin;
    forming a wafer unit by applying an external stimulus to the curable resin to cure the curable resin into a cured resin layer, thereby forming a wafer unit including the protective sheet, the cured resin layer on the protective sheet, the resin film, and the wafer with a reverse side of the wafer being exposed;
    holding the protective sheet of the wafer unit on a holding table;
    thereafter detecting a heightwise position of an upper surface of the reverse side of the wafer along the streets; and
    after detecting the heightwise position, applying a processing laser beam having a wavelength transmittable through the wafer to the wafer from the reverse side thereof along the streets while positioning a focused point of the laser beam within the wafer on a basis of the heightwise position detected in the upper surface, to thereby form modified layers in the wafer along the streets.

11. The method of processing a wafer according to claim 10, wherein after laying a resin film on the face side of the wafer, the protrusions on the face side of the wafer are pressed against the resin film, wherein the resin film is integrally combined with the wafer.

12. The method of processing a wafer according to claim 11, wherein the resin film is heated during the laying a resin film on the face side of the wafer.

13. The method of processing a wafer according to claim 11, comprising applying the curable resin to the protective sheet which is coupled to an annular frame, wherein the covering the resin film with a curable resin comprises bringing the resin film covering the protrusions on the streets of the wafer into contact with the curable resin applied to the protective sheet.

14. The method of processing a wafer according to claim 13, further comprising:
    after applying the laser beam, affixing an expandable sheet to the reverse side of the wafer and removing the protective member and the resin film from the face side of the wafer; and,
    after removing the protective member and the resin film, expanding the expandable sheet to divide the wafer along the modified layers into individual device chips.

15. The method of processing a wafer according to claim 14, wherein the expandable sheet is affixed to the annular frame and then the protective sheet is detached from the annular frame during the removing the protective member and the resin film from the face side of the wafer.

16. The method of processing a wafer according to claim 14,
    the wafer including a plurality of devices formed in respective areas demarcated by the streets, each of the devices including a plurality of bumps,
    the method further comprising:
    after dividing the wafer along the modified layers into individual device chips, installing the device chips on circuits through the bumps.

17. The method of processing a wafer according to claim 10, wherein the resin film is free of a glue layer on a surface thereof that is disposed on the face side of the wafer.

18. The method of processing a wafer according to claim 17,
    wherein the wafer has a plurality of devices disposed on the face side thereof, the devices having a plurality of bumps thereon protruding from the face side of the wafer; and
    wherein when the resin film is peeled off from the wafer, no glue remains sticking to the surfaces of the devices and the bumps.

19. The method of processing a wafer according to claim 17, wherein, prior to forming the wafer unit, the resin film is integrally combined with the face side of the wafer in a vacuum mounting process.

20. The method of processing a wafer according to claim 10, wherein the protrusions on the streets are test element groups (TEGs).

21. The method of processing a wafer according to claim 10, wherein detecting a heightwise position of an upper surface of the reverse side of the wafer along the streets is accomplished using a sensing laser beam applied to the wafer at a location that is 0.5 mm ahead of a location where the processing laser beam is applied to the wafer in a processing direction.

22. The method of processing a wafer according to claim 10, wherein detecting a heightwise position of an upper surface of the reverse side of the wafer along the streets is accomplished using a sensing laser beam applied to the wafer along a street in a first direction, and thereafter the processing laser beam is applied along the street in a second, opposite direction.

* * * * *